United States Patent
Kato

(10) Patent No.: US 7,781,334 B2
(45) Date of Patent: Aug. 24, 2010

(54) METHOD OF MANUFACTURING A SEMICONDUCTOR DEVICE WITH THROUGH-CHIP VIAS

(75) Inventor: Osamu Kato, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 11/808,054

(22) Filed: Jun. 6, 2007

(65) Prior Publication Data

US 2008/0014742 A1 Jan. 17, 2008

(30) Foreign Application Priority Data

Jul. 11, 2006 (JP) ............... 2006-190234

(51) Int. Cl.
*H01L 21/4763* (2006.01)
(52) U.S. Cl. .................. 438/643; 438/642; 438/648; 438/653; 438/675; 438/745
(58) Field of Classification Search ............. 438/642, 438/643, 648, 652, 653, 675, 685, 687, 700, 438/702, 703, 745, FOR. 355
See application file for complete search history.

(56) References Cited

U.S. PATENT DOCUMENTS

| 5,185,210 A * | 2/1993 | Zupancic | 428/457 |
| 7,129,133 B1 * | 10/2006 | Avanzino et al. | 438/244 |
| 2005/0124164 A1 * | 6/2005 | Sakata et al. | 438/689 |
| 2005/0227382 A1 * | 10/2005 | Hui | 438/14 |
| 2006/0046454 A1 * | 3/2006 | Collins et al. | 438/597 |
| 2006/0170020 A1 * | 8/2006 | Ohta et al. | 257/295 |

FOREIGN PATENT DOCUMENTS

| JP | 11-345933 | 12/1999 |
| JP | 2001-345324 | 12/2001 |
| JP | 2004-525510 | 8/2004 |
| JP | 2005-045285 A | 2/2005 |

OTHER PUBLICATIONS

Translation for Document JP-2001-345324, Filed Dec. 14, 2001, document cited on IDS filed Jun. 6, 2007, pp. 1-8.*
Sorab K. Ghandhi, VLSI Fabrication Principles Silicon and Gallium Arsenide, 1994, John Wiley & Sons, Inc., Second Edition, p. 726.*

* cited by examiner

*Primary Examiner*—N Drew Richards
*Assistant Examiner*—Joannie A Garcia
(74) *Attorney, Agent, or Firm*—Rabin & Berdo, P.C.

(57) ABSTRACT

An electrode is formed in a hole extending partway into the substrate of a semiconductor device by depositing an insulating film and a barrier metal layer on the substrate surface and the interior of the hole, then filling the hole with a layer of electrode material that also covers the substrate surface. Next, the electrode material exterior to the hole is removed by wet etching, using an etchant that does not etch the barrier metal. The barrier metal exterior to the hole is then removed by wet etching, using an etchant that does not etch the electrode material. This process eliminates the need for expensive chemical mechanical polishing.

20 Claims, 8 Drawing Sheets

METHOD OF MANUFACTURING A SEMICONDUCTOR DEVICE WITH THROUGH-CHIP VIAS

BACKGROUND OF THE INVENTION

1. Field of the Invention

The present invention relates to a method of manufacturing a semiconductor device, and in particular to a method of forming electrodes on a substrate.

2. Description of the Related Art

Semiconductor devices with a three-dimensional structure comprising stacked semiconductor substrates are known. In such devices, integrated circuits formed on the upper surfaces of different substrates or 'chips' are interconnected by conductive (e.g., copper) electrodes that pass through one of the substrates, or by a series of such electrodes passing through a series of substrates. The electrodes, sometimes referred to as through-chip via electrodes, are first formed in holes that pass only partway through each substrate from its upper toward its lower surface. After electrode formation, the lower substrate surface is etched away until the lower ends of the electrodes are exposed.

Japanese Patent Application Publication (JP) No. 2001-345324 discloses a method of forming such electrodes that begins by forming holes in the substrate by a dry etching process such as reactive ion etching (RIE). Next an insulating film and a layer of barrier metal are deposited on the surface of the substrate, including the interior sides and bottom surfaces of the holes. The barrier metal layer has two functions: to prevent diffusion of the electrode material into the substrate and to ensure tight contact of the electrode material with the interior of the hole. To obtain these two effects, a plurality of barrier metal layers may be formed one on another as disclosed in, for example, JP 11-345933.

After the barrier layer or layers have been formed, the holes are filled with the copper or another electrode material by an electroplating process. This process deposits electrode material not only in the holes but also on the entire surface of the substrate. The electrode material and barrier metal outside the holes are then removed, usually by chemical-mechanical polishing (CMP), leaving the electrodes in the holes.

Since CMP is a time-consuming process with a low polishing rate, JP 2001-345324 teaches the removal of material deposited outside the holes by an etching process followed by CMP. The etching process quickly removes most of the electrode material from the surface of the substrate. The barrier metal layer is used as an etch stopper: etching stops when this layer is exposed. Due to surface irregularities, some of the electrode material deposited on the barrier metal outside the holes is also left, so that the exposed surface is a patchwork of barrier metal and electrode material. The CMP process then removes the electrode material and barrier metal from parts of the substrate surface outside the holes.

CMP, which is also widely used to planarize layers and films, employs a polishing pad and a chemical slurry. A problem is that the slurry is expensive and is consumed in large quantities. The method of JP 2001-345324, which uses CMP to remove the barrier metal and part of the electrode material from areas outside the holes, is therefore costly. It would be desirable to have a less expensive method of removing the unwanted electrode material and barrier metal.

SUMMARY OF THE INVENTION

An object of the present invention is to form through-chip via electrodes in a semiconductor device inexpensively.

A more specific object is to form through-chip via electrodes without using chemical-mechanical polishing.

The invented method of manufacturing a semiconductor device includes the steps of:

forming a hole extending partway into a substrate;

forming an insulating film covering the interior side and bottom surfaces of the hole and the surface of the substrate;

forming a metal lining layer covering the insulating film;

forming an electrode material layer covering the metal lining layer and filling the hole;

removing the part of the electrode material layer exterior to the hole by wet etching, leaving an electrode embedded in the hole; and removing the part of the metal lining layer exterior to the hole by wet etching.

The metal lining layer may be a layer of barrier metal, or may include both a barrier metal layer and a low-resistance metal layer intervening between the barrier metal layer and the electrode material layer.

Further steps may be carried out to connect the embedded electrode to a circuit element in the substrate and/or to an external terminal, and to remove the lower part of the substrate so that the electrode passes completely through the substrate.

The first wet etching step in this method removes all unwanted parts of the electrode material layer, including all parts of this layer covering the metal lining layer exterior to the hole. The second wet etching step can accordingly be carried out using an etchant that selectively etches the lining metal without etching the electrode material. The lining metal layer can therefore be removed completely from areas exterior to the hole without chemical-mechanical polishing.

The invented method of manufacturing a semiconductor device forms through-chip via electrodes inexpensively because it does not consume chemical slurry.

If the metal lining layer includes a low-resistance metal layer in addition to a barrier metal layer, the thickness of the barrier metal layer can then be reduced and the electrical resistance of the electrode can be reduced, especially in comparison with conventional electrodes having multiple barrier layers.

DETAILED DESCRIPTION OF THE INVENTION

Figure 1:
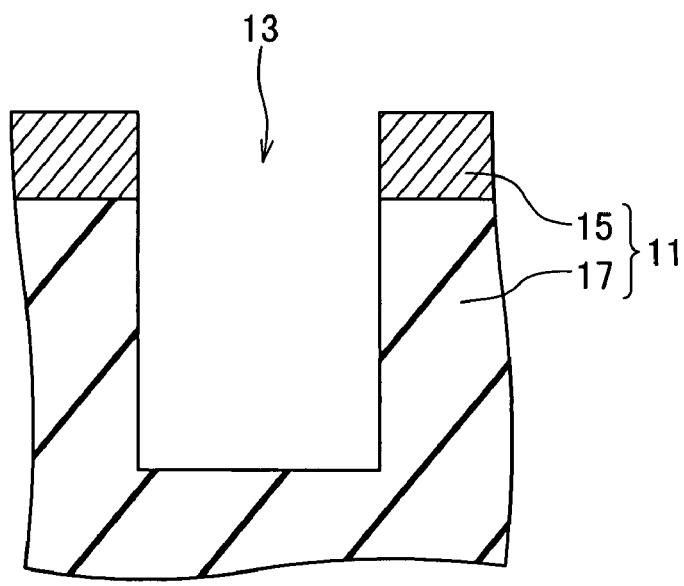
FIGS. 1 and 2 illustrate steps in a method of manufacturing a semiconductor device according to first and second embodiments of the invention.

Embodiments of the invention will now be described with reference to the attached drawings, in which like elements are indicated by like reference characters. The drawings illustrate the formation of a single electrode, but it will be appreciated that many similar electrodes can be formed simultaneously.

First Embodiment

The first embodiment is a method of manufacturing a semiconductor device including the six steps illustrated in FIGS. 1 to 6.

Referring to FIG. 1, in the first step a hole 13 is formed in a substrate 11. The substrate 11 includes both a semiconductor substrate 17 such as a silicon substrate or a silicon-on-insulator (SOI) substrate and an interlayer dielectric film 15 covering the upper surface of the semiconductor substrate 17. The hole 13 extends through the interlayer dielectric film 15 and partly into the semiconductor substrate 17. The hole 13 is formed by well-known processes such as photolithography and reactive ion etching or some other type of dry etching.

Figure 2:
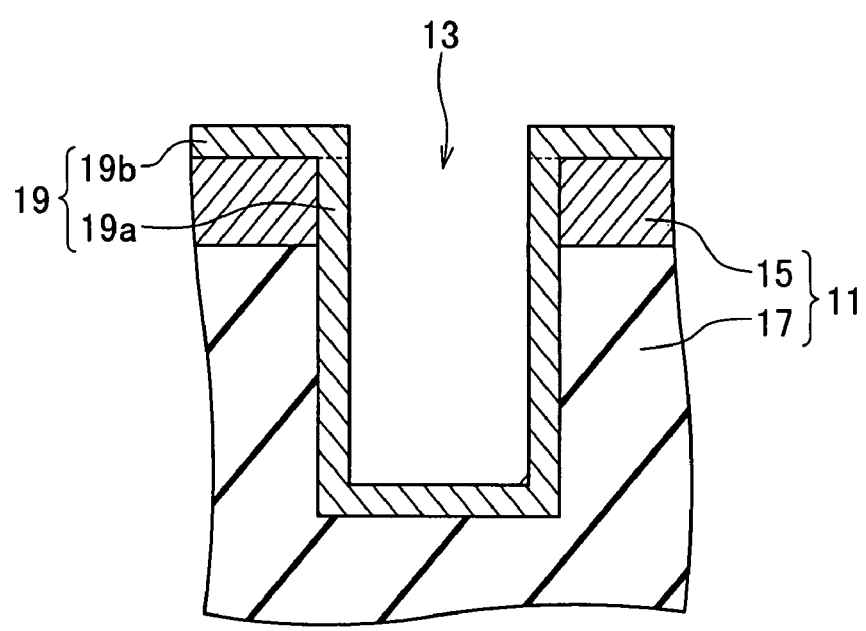

Referring to FIG. 2, in the second step an insulating film 19 is deposited on the substrate 11. The insulating film 19 may be, for example, an oxide film, a nitride film, a multilayer film including both oxide and nitride layers, or any other known type of dielectric film. An oxide film may be formed by thermal oxidation or chemical vapor deposition (CVD). A nitride film may be formed by CVD. If the hole is thirty micrometers (30 μm) in diameter, an oxide film with a thickness of five hundred to one thousand five hundred nanometers (500-1500 nm) or a nitride film with a thickness of 50-150 nm is preferred. The maximum thickness of the insulating film 19, when the oxide film and nitride film are combined, is then 1650 nm. Since the diameter of the hole 13 is approximately 18.9 times this dimension, the insulating film 19 can be deposited without filling in the hole 13.

Although the insulating film 19 is a continuous film, it is convenient to consider it as comprising an interior insulating film 19a covering the interior side and bottom surfaces of the hole 13 and an exterior insulating film 19b disposed exterior to the hole 13.

Figure 3:
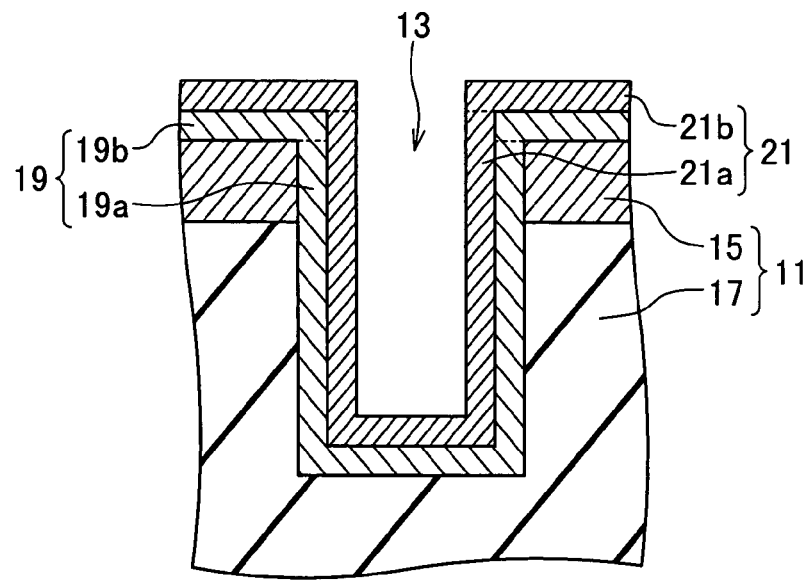
FIGS. 3, 4, 5, and 6 illustrate further steps in the first embodiment.

Referring to FIG. 3, in the third step a barrier metal layer 21 is deposited on the insulating film 19.

The barrier metal layer 21 is formed of a conductive metal such as titanium or tantalum by physical vapor deposition (PVD), CVD, or any other known process. The barrier metal layer 21 has two functions: to prevent diffusion of the electrode material into the semiconductor substrate 17 in the fourth step and to ensure tight contact of the electrode material with the interior of the hole 13. To obtain these two effects, if the hole 13 is 30 μm in diameter, a barrier metal layer 21 with a thickness of 500-1500 nm is preferred. Although this value of 500-1500 nm is within the range that provides these two effects, as long as these two effects are obtained, the thickness may have any value in the general vicinity of 500-1500 nm.

In the fourth step, electrode material will be deposited on the barrier metal layer 21, covering the exterior barrier metal layer 21b as well as filling the hole 13, and in the fifth step, the electrode material will be removed down to a level even with an uppermost surface of the exterior insulating film 19b, thereby forming an electrode within the hole 13. The fourth and fifth steps will be described in more detail below. The fifth step will be carried out so as to remove a thickness of electrode material five percent greater than the thickness of the part of the electrode material disposed above the exterior barrier metal layer 21b. In order to leave the upper surface of the electrode at the level of the uppermost surface of the exterior insulating film 19b, the thickness of the barrier metal layer 21 in the first embodiment is preferably equal to five percent of the intended thickness of the electrode material.

The barrier metal layer 21 is preferably deposited so as to have a uniform thickness equal to this value, to prevent the formation of recessed electrode surfaces.

Although the barrier metal layer 21 is a continuous layer, it is convenient to consider it as comprising an interior barrier metal layer 21a covering the interior side and bottom surfaces of the interior insulating film 19a and an exterior barrier metal layer 21b covering the exterior insulating film 19b and the upper edges of the interior barrier metal layer 21a. The exterior barrier metal layer 21b will be removed later.

Figure 4:
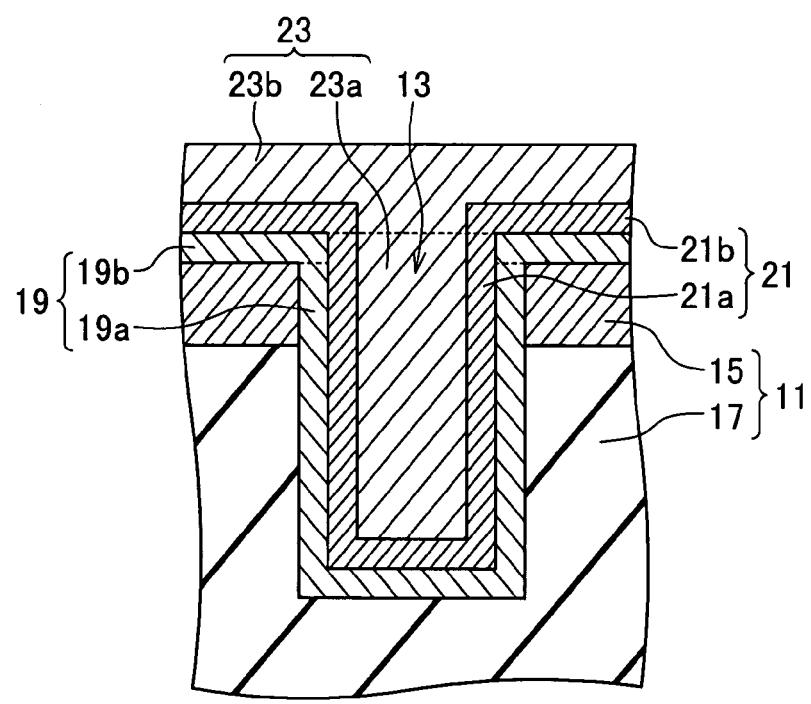

Referring to FIG. 4, in the fourth step the electrode material 23 is deposited on the barrier metal layer 21.

Although the electrode material 23 is a continuous layer, it is convenient to consider it as comprising interior electrode material 23a filling the hole 13 up to a level even with the uppermost surface of the exterior insulating film 19b and exterior electrode material 23b covering the interior electrode material 23a and the exterior barrier metal layer 21b.

The electrode material 23 may be formed of a conductive metal such as copper or tungsten. The deposition of copper electrode material 23 will be described below as an example.

When the electrode material 23 is formed of copper, the preferred deposition method is a well-known electroplating process. Before the actual electroplating begins, first a seed metal layer (not shown) is formed as a continuous layer with an interior part covering the interior side and bottom surfaces of the interior barrier metal layer 21a and an exterior part covering the exterior barrier metal layer 21b. The seed metal layer is formed of copper and will become part of the electrode material 23. The seed metal layer is then used as a cathode to deposit further copper, completing the deposition of electrode material 23. In order to ensure functioning of the seed metal layer as a cathode, if the hole 13 is 30 μm in diameter, the seed metal layer preferably has a thickness of 100-1000 nm. Although this value of 100-1000 nm is within the range in which the seed metal layer functions as a cathode, provided this function is obtained, the seed layer may have any thickness in the general vicinity of 100-1000 nm. The seed metal layer may be formed by CVD or PVD.

The electroplating of copper onto the seed metal layer is a well-known process in which the seed metal layer carries current that attracts copper ions. The seed metal layer is deposited not only on the interior side and bottom surfaces of the interior barrier metal layer 21a but also on the entire surface of the exterior barrier metal layer 21b in order to increase the conductive area through which current can be carried to the interior surfaces of the hole 13. Copper that plates onto the part of the seed metal layer covering the interior side and bottom surfaces of the interior barrier metal layer 21a becomes interior electrode material 23a. Copper that plates onto the part of the seed metal layer covering the exterior barrier metal layer 21b and the upper edges of the interior barrier metal layer 21a becomes exterior electrode material 23b. Since it will be removed in the fifth step, the exterior electrode material 23b is a type of dummy electrode material. The interior electrode material 23a is a type of electrode precursor material.

Figure 5:
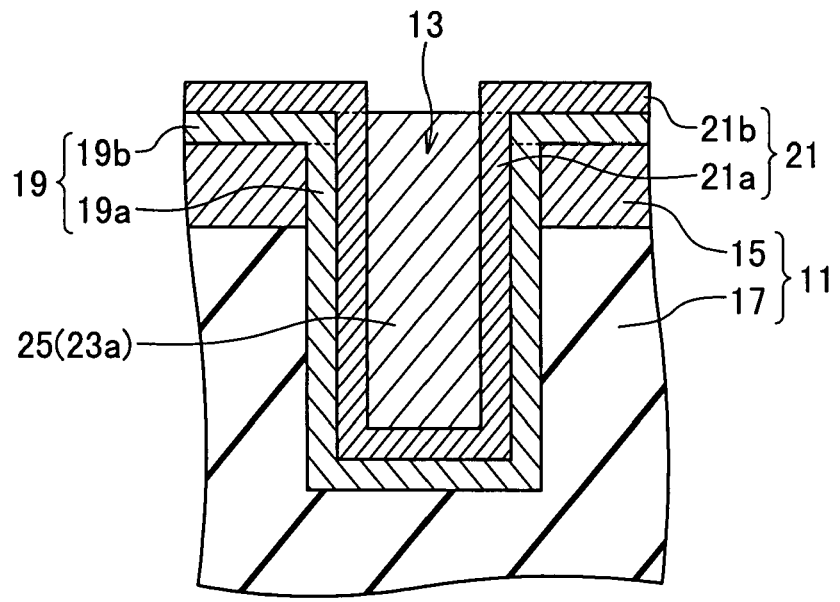

Referring to FIG. 5, in the fifth step the exterior electrode material 23b is removed by a well-known selective wet etching process.

The etchant used in this selective wet etching process etches the electrode material 23 but not the barrier metal layer 21. More precisely, the electrode material 23 is etched much more rapidly than the barrier metal layer 21. If the electrode material 23 is copper and the barrier metal layer 21 is formed of titanium, for example, a sulfuric acid or nitric acid etchant such as sodium persulfate is preferred.

When the electrode material 23 is formed by the electroplating process described above, it is known from experience that variations may occur in the thickness of the electrode material 23, including both the thickness of the interior electrode material 23a and the thickness of the exterior electrode material 23b. The thickness variations on the whole surface of the substrate 11 are generally within a total range of plus or minus five percent of the nominal value. In order to remove the exterior electrode material 23b completely, the wet etching time is precalculated according to the known thickness and etching rate of the electrode material 23 so as to remove the nominal thickness of the exterior electrode material 23b disposed above the interior electrode material 23a plus five percent of that thickness. The wet etching process is stopped at the end of the precalculated time.

The remaining interior electrode material 23a left within the hole 13 constitutes the electrode 25. If the thickness of the barrier metal layer 21 formed in the third step is set at five percent of the nominal thickness of the electrode material 23, then when the wet etching process is stopped, the upper surface of the electrode 25 will be even with the uppermost surface of the exterior insulating film 19b, and all of the exterior electrode material 23b will have been removed from the surface of the exterior barrier metal layer 21b, even if some parts of the exterior electrode material 23b are up to five percent thicker than nominal.

Although the fifth step should remove the exterior electrode material 23b completely from the upper surface of the exterior barrier metal layer 21b, it is not necessary to remove all of the exterior electrode material 23b overlying the interior electrode material 23a in the part of the hole 13 between the level even with the surface of the interior electrode material 23a and the level even with the upper surface of the exterior barrier metal layer 21b. Any portion of the exterior electrode material 23b that may remain in this region combines with the interior electrode material 23a left in the hole 13 to form the electrode 25. The upper surface of the electrode 25 may accordingly be higher than the uppermost surface of the exterior insulating film 19b, by an amount not exceeding the thickness of the exterior barrier metal layer 21b.

Figure 6:
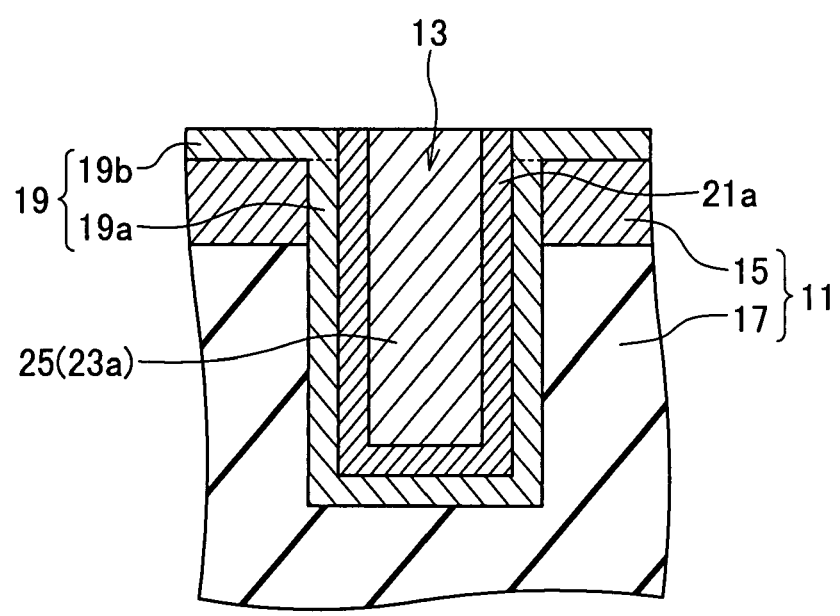

Referring to FIG. 6, in the sixth step the exterior barrier metal layer 21b is removed by a selective wet etching process.

The etchant used in this selective wet etching process etches the barrier metal layer 21 but not the insulating film 19 and the electrode 25 (the interior electrode material 23a). More precisely, the barrier metal layer 21 is etched much more rapidly than the dielectric film and the electrode material. If the barrier metal layer 21 is formed of titanium, the electrode 25 is formed of copper, and the insulating film 19 is a multilayer film including both oxide and nitride layers, for example, a potassium hydroxide and hydrogen peroxide etchant is preferred. The wet etching time should be precalculated according to the known thickness and etching rate of the exterior barrier metal layer 21b so as to remove the exterior barrier metal layer 21b completely. The wet etching process is stopped at the end of the precalculated time.

Since the fifth step in the first embodiment removes all of the exterior electrode material 23b from the surface of the exterior barrier metal layer 21b, instead of leaving a patchwork of barrier metal and electrode material as in JP 2001-345324, the selective wet etching process in the sixth step is able to remove all of the exterior barrier metal layer 21b, eliminating the need for the CMP process required in JP 2001-345324.

As described above, according to the method of manufacturing a semiconductor device in the first embodiment, the exterior electrode material 23b on the surface of the exterior barrier metal layer 21b is removed in the fifth step, and the exterior barrier metal layer 21b is removed in the sixth step. By using two wet etching processes instead of the single wet etching process disclosed in JP 2001-345324, the first embodiment succeeds in removing the exterior electrode material 23b and exterior barrier metal layer 21b completely without the need for CMP. The first embodiment thus forms the electrode 25 inexpensively because it does not consume chemical slurry.

The thickness of the barrier metal layer 21 formed in the third step should be selected in relation to anticipated thickness variations in the barrier metal layer 21 and electrode material 23 so that at the end of the first wet etching step (the fifth step), all of the exterior electrode material 23b has been removed from the surface of the exterior barrier metal layer 21b, but the upper surface of the electrode 25 is no lower than the uppermost surface of the exterior insulating film 19b, and preferably about even with this surface. The first embodiment then provides a semiconductor device with a comparatively flat surface that allows a reliable electrical connection to be formed with the electrode 25.

Second Embodiment

The second embodiment is a method of manufacturing a semiconductor device including the seven steps illustrated in FIGS. 1, 2, and 7 to 11.

The method of in the second embodiment differs from the method in the first embodiment by depositing a low-resistance metal layer on the barrier metal layer.

The first and second steps in the second embodiment are the same as the first and second steps in the first embodiment. As shown in FIGS. 1 and 2, in the first step a hole 13 is formed in a substrate 11, and in the second step an insulating film 19 is deposited on the substrate 11.

Figure 7:
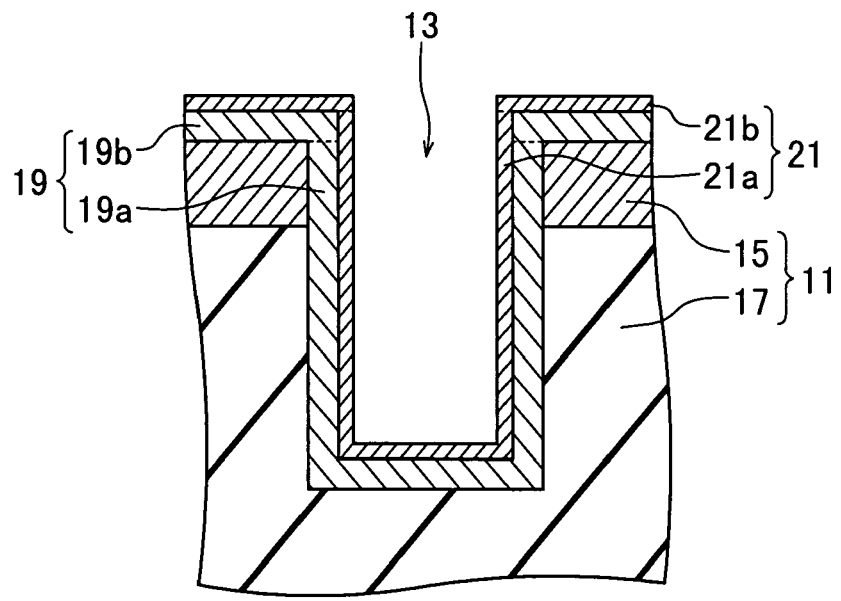
FIGS. 7, 8, 9, 10, and 11 illustrate further steps in the second embodiment.

Referring to FIG. 7, in the third step a barrier metal layer 21 is deposited on the insulating film 19.

The barrier metal layer 21 is formed of a conductive metal such as titanium or tantalum by PVD, CVD, or any other known process as in the first embodiment. Since another metal layer (a low-resistance metal layer) will be deposited on the barrier metal layer 21 in the fourth step, the thickness of the barrier metal layer 21 in the second embodiment may be less than the thickness of the barrier metal layer in the first embodiment. If the hole 13 is 30 μm in diameter, the barrier metal layer 21 preferably has a uniform thickness of 500 nm. Although this value of 500 nm is within the range that provides the effect of reduced electrical resistance, as long as this effect is obtained, the thickness may have any value in the general vicinity of 500 nm.

Figure 8:
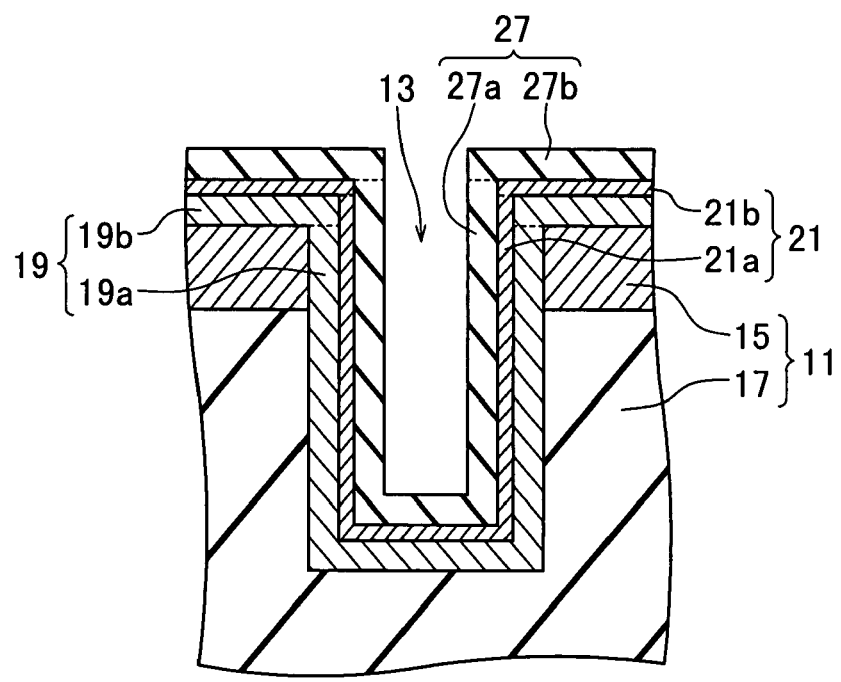

Referring to FIG. 8, in the fourth step the low-resistance metal layer 27 is deposited on the barrier metal layer 21.

The low-resistance metal layer 27 is formed of a metal more conductive than the barrier metal layer 21, such as aluminum or gold, by PVD, CVD, or any other known process. The thickness of the low-resistance metal layer 27 formed in the fourth step should be selected so that after the final wet etching process in the seventh step, the upper surface of the electrode will be left even with the uppermost surface of the exterior insulating film 19b. If this final wet etching process is carried out so as to remove a thickness of electrode material five percent greater than the nominal thickness of the part of the electrode material disposed above the exterior low-resistance metal layer 27b, as in the first embodiment, then the combined thickness of the barrier metal layer 21 and low-resistance metal layer 27 should be equal to five percent of the nominal thickness of the electrode material. The barrier metal layer 21 and the low-resistance metal layer 27 are preferably deposited so as to have a uniform thickness equal to this value, to prevent the formation of a recessed electrode surface.

The comparatively high conductivity of the low-resistance metal layer 27 reduces the parasitic resistance of the electrode.

Although the low-resistance metal layer 27 is a continuous layer, it is convenient to consider it as comprising an interior low-resistance metal layer 27a covering the interior side and bottom surfaces of the interior barrier metal layer 21a and an exterior low-resistance metal layer 27b covering the exterior barrier metal layer 21b and the upper edges of the interior low-resistance metal layer 27a. The exterior low-resistance metal layer 27b will be removed later.

Figure 9:
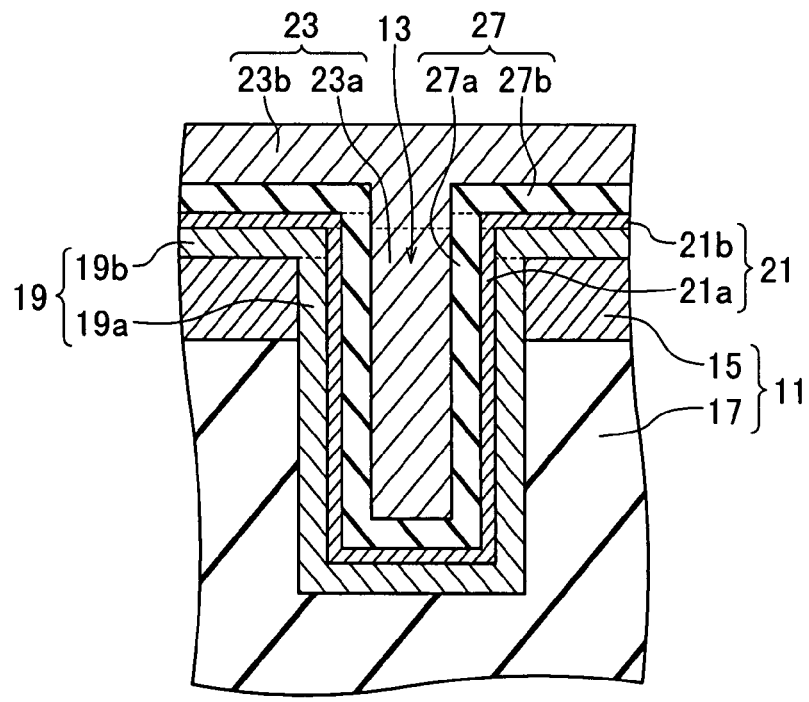

Referring to FIG. 9, in the fifth step the electrode material 23 is deposited on the low-resistance metal layer 27, essentially described as in the fourth step in the first embodiment. The electrode material 23 is formed of a conductive metal such as copper or tungsten. When the electrode material 23 is formed of copper, the electroplating process described in the first embodiment may be used, or any other suitable process may be used.

Although the electrode material 23 is a continuous layer, it is convenient to consider it as comprising interior electrode material 23a filling the hole 13 up to a level even with the uppermost surface of the exterior insulating film 19b and exterior electrode material 23b covering the interior electrode material 23a and the exterior low-resistance metal layer 27b.

Figure 10:
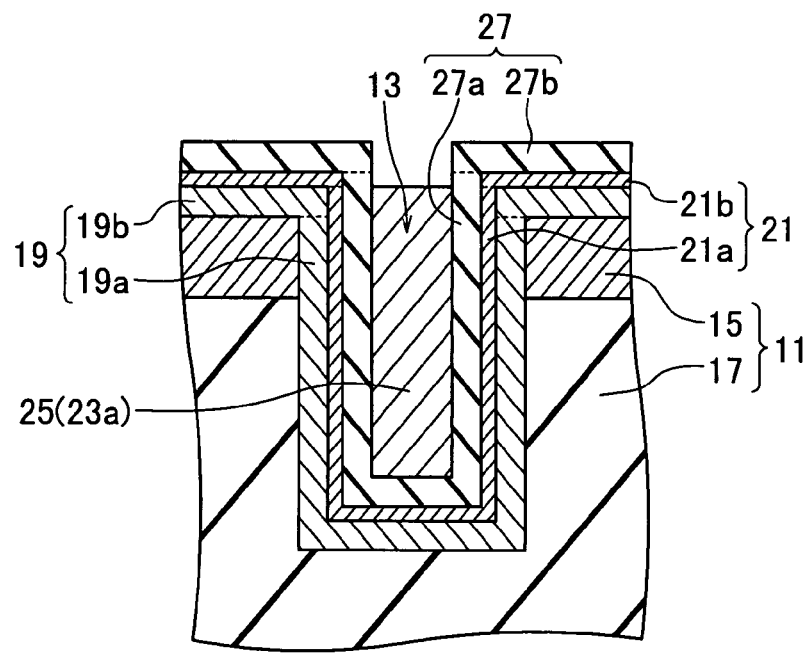

Referring to FIG. 10, in the sixth step the exterior electrode material 23b is removed by a well-known selective wet etching process.

The etchant used in this selective wet etching process etches the electrode material 23 but not the low-resistance metal layer 27. More precisely, the electrode material 23 is etched much more rapidly than the low-resistance metal layer 27. If the electrode material 23 is formed of copper and the low-resistance metal layer 27 is formed of aluminum, for example, a sodium persulfate etchant is preferred.

When the electrode material 23 is formed by the electroplating process described in the first embodiment, the wet etching time should be precalculated according to the known thickness and etching rate of the electrode material 23 so as to remove the nominal thickness of the exterior electrode material 23b disposed above the interior electrode material 23a plus five percent of that thickness, to allow for the thickness variations described in the first embodiment. The wet etching process is stopped at the end of the precalculated time.

The remaining interior electrode material 23a left within the hole 13 constitutes the electrode 25. If the combined thickness of the barrier metal layer 21 formed in the third step and the low-resistance metal layer 27 formed in the fourth step is five percent of the thickness of the electrode material 23, then when the wet etching process in the sixth step is stopped, the upper surface of the electrode 25 will be even with the uppermost surface of the exterior insulating film 19b, and all of the exterior electrode material 23b will have been removed from the surface of the exterior low-resistance metal layer 27b, even if some parts of the exterior electrode material 23b are up to five percent thicker than nominal.

As in the first embodiment, the upper surface of the electrode 25 need not be exactly even with the uppermost surface of the exterior insulating film 19b. It may be higher than the uppermost surface of the exterior insulating film 19b, provided it is lower than the lowest point on the uppermost surface of the exterior low-resistance metal layer 27b. Accordingly, some of the exterior electrode material 23b may be left in the hole 13, where it becomes part of the electrode 25.

Figure 11:
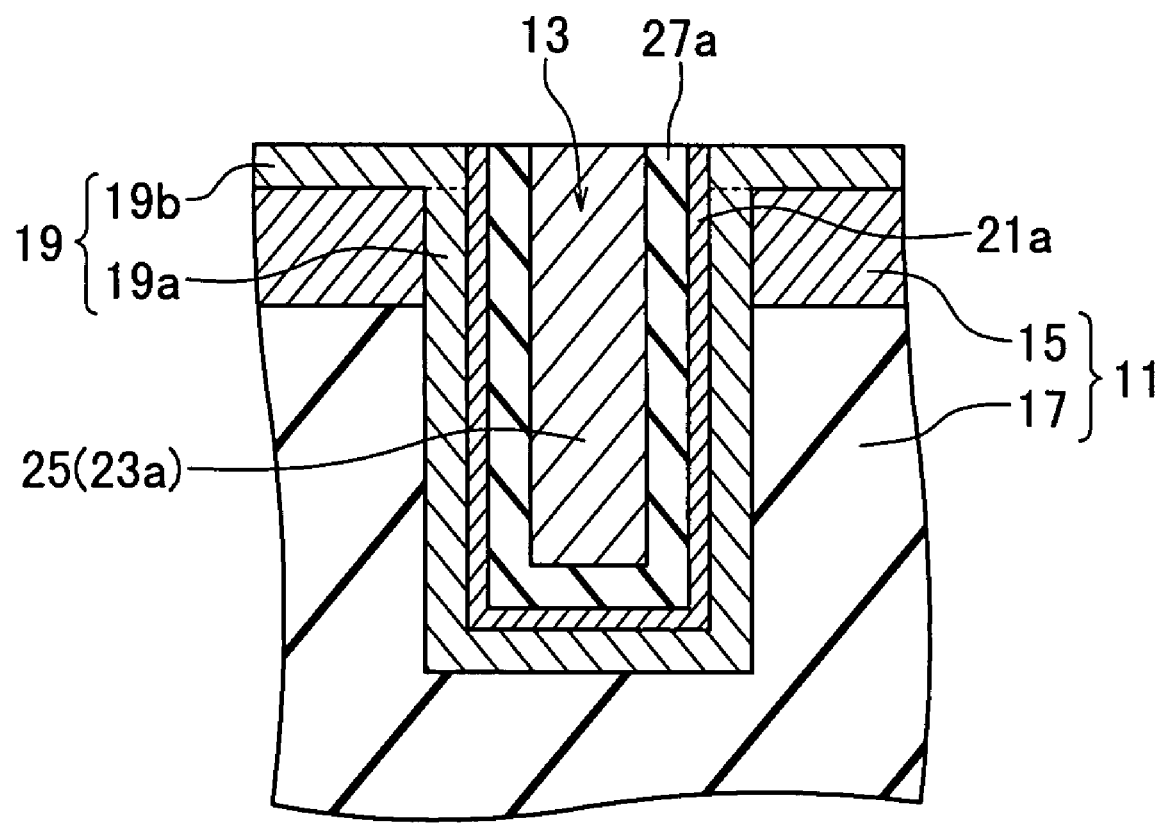

Referring to FIG. 11, in the seventh step the exterior low-resistance metal layer 27b and the exterior barrier metal layer 21b are removed by a selective wet etching process.

The etchant used in this selective wet etching process etches the low-resistance metal layer 27 and the barrier metal layer 21 but not the insulating film 19 and the electrode 25 (interior electrode material 23a). More precisely, the low-resistance metal layer 27 and the barrier metal layer 21 are etched much more rapidly than the insulating film 19 and the electrode 25 (interior electrode material 23a). If the low-resistance metal layer 27 is formed of aluminum, and the barrier metal layer 21 is formed of titanium, for example, a dilute hydrofluoric acid etchant is preferred. In order to remove the exterior low-resistance metal layer 27b and the exterior barrier metal layer 21b completely, the wet etching time is precalculated according to the known thickness and etching rate of the exterior low-resistance metal layer 27b and exterior barrier metal layer 21b as in the first embodiment. The wet etching process is stopped at the end of the precalculated time.

If the thicknesses of the barrier metal layer 21 and low-resistance metal layer 27 are set as described above and the wet etching time in the sixth step is calculated to remove an amount of electrode material equal to the nominal thickness of the electrode material 23 plus the combined thickness of the barrier metal layer 21 and low-resistance metal layer 27, then the two wet etching processes performed in the sixth and seventh steps leave the semiconductor device with a substantially flat surface in which the top the electrode 25 is substantially even with the uppermost surface of the exterior insulating film 19b, enabling a reliable electrical connection to be formed.

In the first embodiment, the function of preventing diffusion of the electrode material into the substrate and ensuring tight contact of the electrode material with the interior of the hole 13 was given entirely to the barrier metal layer 21, while in the second embodiment this function is partly performed by the low-resistance metal layer 27. The thickness of the barrier metal layer 21 in the second embodiment can therefore be reduced. Since the low-resistance metal layer 27 is more conductive than the barrier metal layer 21, this reduces the parasitic resistance of the electrode in comparison with the first embodiment, or with conventional electrodes having multiple barrier layers.

An exemplary method of forming an electrical connection with an electrode fabricated according to the first or second embodiment will now be described. The electrode will be connected both to an external terminal and to an internal circuit element in the semiconductor device.

Figure 12:
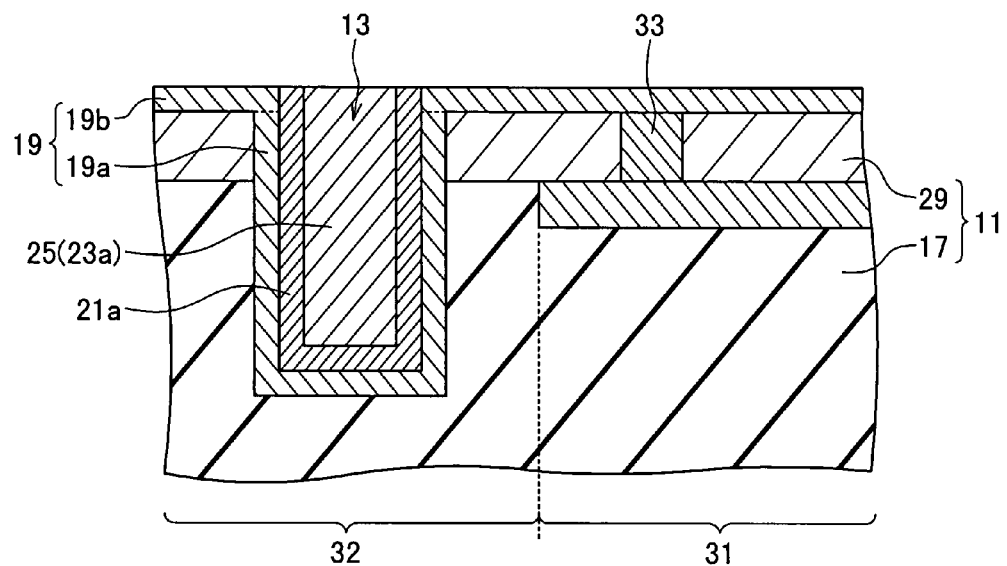
FIGS. 12, 13, and 14 illustrate the formation of an interconnecting wire in a semiconductor device manufactured according to the first embodiment.

Referring to FIG. 12, the substrate 11 in which the electrode 25 is formed includes both a semiconductor substrate 17 and an interlayer dielectric film, which will now be referred to as a first dielectric film 29 to distinguish it from further dielectric films that will be formed. The semiconductor substrate 17 includes a chip area 31 in which various semiconductor circuit elements (not shown) are formed. The first dielectric film 29 includes a plug 33 of a conductive metal such as tungsten, leading from the upper surface of the first dielectric film 29 to one of the circuit elements in the chip area 31.

The semiconductor substrate 17 also includes a peripheral area 32 in which the electrode 25 is formed. The electrode 25 may be formed as described in either the first or the second embodiment; the electrode 25 shown in FIG. 12 has been formed by the method described in the first embodiment. After electrode formation, the exterior insulating film 19*b* covers the substrate 11, including the plug 33, but the surface of the electrode 25 is exposed.

Figure 13:
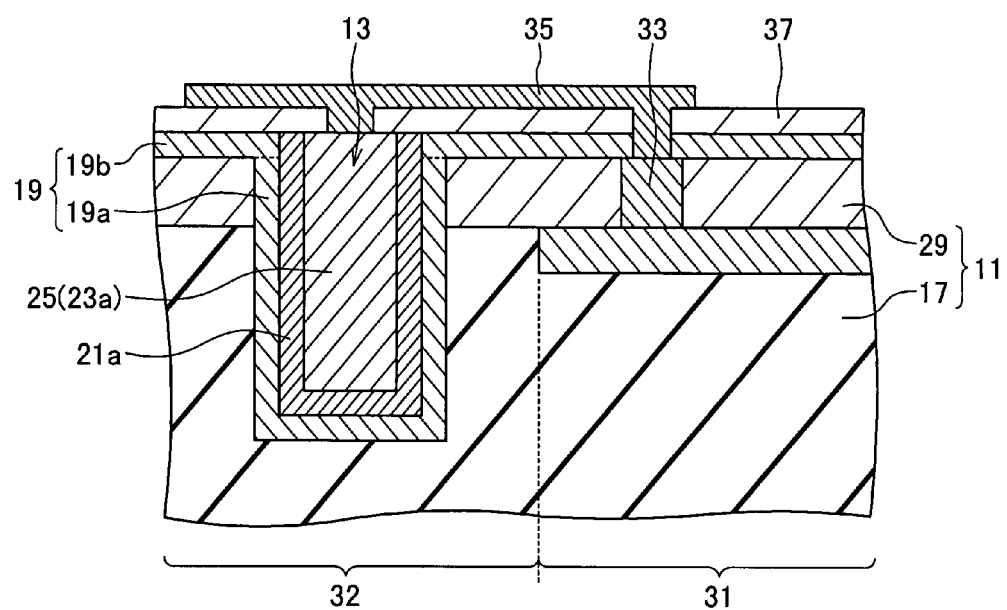

Referring to FIG. 13, an interconnecting wire 35 for connecting the electrode 25 to the plug 33 is formed. First an second dielectric film 37 is deposited on the whole surface of the substrate 11, including the surface of the electrode 25. Holes are then opened in the second dielectric film 37 and exterior insulating film 19*b* by a well-known photolithography and dry etching process: one hole leads through the second dielectric film 37 to the surface of the electrode 25; another hole leads through the second dielectric film 37 and exterior insulating film 19*b* to the surface of the plug 33. The interconnecting wire 35 is formed on the surface of the second dielectric film 37 and extends over both holes, so that the interconnecting wire 35 fills the holes and makes electrical contact with the exposed surfaces of the electrode 25 and the plug 33. The interconnecting wire 35 may formed by depositing and patterning a film of a conductive metal such as aluminum or copper. The patterning may be accomplished by well-known photolithography and dry etching processes, or by an also well-known damascene process.

Figure 14:
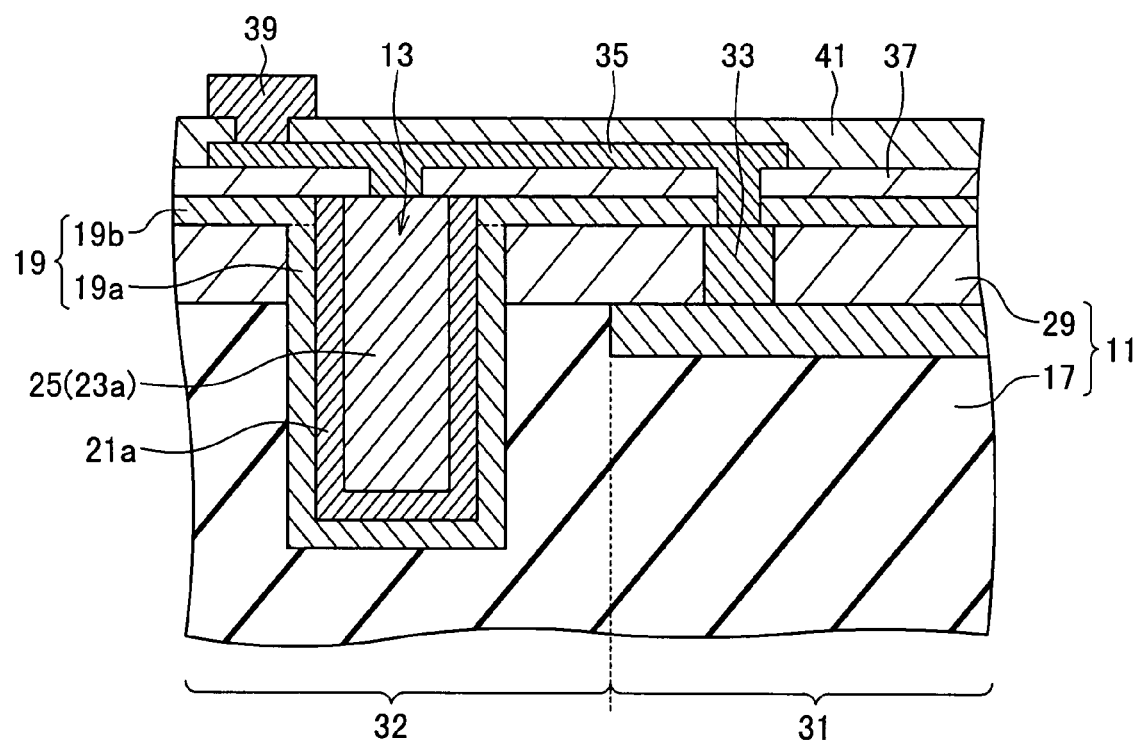

Referring to FIG. 14, the external terminal 39 is formed on the interconnecting wire 35. First, a third dielectric film 41 is deposited on the entire surface of the device, including the interconnecting wire 35 and the exposed part of the second dielectric film 37. A hole is then opened in the third dielectric film 41 by well-known photolithography and dry etching processes at a location above the interconnecting wire 35, exposing part of the surface of the interconnecting wire 35. The external terminal 39 is formed on the third dielectric film 41 and fills this hole, making electrical contact with the exposed surface of the interconnecting wire 35. The external terminal 39 is formed of a conductive metal such as copper by well-known processes such as photolithography and dry etching.

In a subsequent step (not shown) the lower part of the barrier metal layer 21 is removed to expose the lower end of the electrode 25. The semiconductor integrated circuit in the semiconductor substrate 17 can then be electrically connected to another semiconductor device (not shown) stacked above or below, the upward connection being made through the interconnecting wire 35 and external terminal 39, the downward connection being made through the interconnecting wire 35 and electrode 25. Alternatively, either the electrode 25 or the external terminal 39 may be connected to a wiring pattern on an external substrate such as a printed circuit board, to a lead in a package, or to a bonding wire leading to another electronic device.

The usage of the electrode 25 is not limited to the type of interconnection shown in FIG. 14. For example, the external terminal 39 may be omitted. Alternatively, the interconnecting wire 35 may be omitted and the external terminal 39 may be positioned directly above the electrode 25 and lead through the second dielectric film 37 to the surface of the electrode 25; in this case the electrode 25 may be used to interconnect two other semiconductor devices (not shown) stacked on opposite sides of the semiconductor device in which the electrode 25 is formed, or to connect one such semiconductor device to an external terminal.

Those skilled in the art will recognize that further variations are possible within the scope of the invention, which is defined in the appended claims.

What is claimed is:

1. A method of manufacturing a semiconductor device, comprising:

forming a hole in a substrate, the hole extending from an upper surface of the substrate to a first level within the substrate;

forming an insulating film as a continuous film with an interior part covering an interior side surface and a bottom surface of the hole and an exterior part covering the upper surface of the substrate;

forming a metal lining layer as a continuous layer with an interior part covering an interior side surface and a bottom surface of the interior part of the insulating film and an exterior part covering the exterior part of the insulating film;

forming an electrode material layer as a continuous layer with an interior part filling the hole up to a second level even with an uppermost surface of the exterior part of the insulating film and an exterior part covering the interior part of the electrode material layer and the exterior part of the metal lining layer;

removing the exterior part of the electrode material layer from the exterior part of the metal lining layer by wet etching, so that the upper surface of the electrode material layer within the hole is disposed at a level lower than an upper surface of the metal lining layer, thereby forming an electrode including the interior part of the electrode material layer left within the hole; and removing the exterior part of the metal lining layer by wet etching.

2. The method of claim 1, further comprising removing substrate material at least below the first level to expose a lower end of the electrode.

3. The method of claim 1, further comprising forming an external terminal on the semiconductor device, the external terminal being electrically connected to the electrode.

4. The method of claim 1, further comprising:

forming an integrated circuit element in the substrate; and forming an interconnecting wire on the substrate, the interconnecting wire electrically interconnecting the integrated circuit element with the electrode.

5. The method of claim 1, wherein the electrode material layer is etched more rapidly than the exterior part of the metal lining layer, such that the electrode material layer is wet-etched down to the second level, thereby leaving only the interior part of the electrode material layer in the electrode.

6. The method of claim 1, wherein the electrode material layer is etched more rapidly than the exterior part of the metal lining layer, such that the electrode material layer is wet-etched down to the level that is higher than the second level and lower than the upper surface of the exterior part of the metal lining layer, thereby leaving some of the exterior part of the electrode material layer in the electrode.

7. The method of claim 1, wherein the electrode material layer comprises copper.

8. The method of claim 7, wherein forming the electrode material layer further comprises:

depositing a seed layer of copper on the metal lining layer; and electroplating copper onto the seed layer.

9. The method of claim 1, wherein the electrode material layer comprises tungsten.

10. The method of claim 1, wherein the metal lining layer is a layer of a barrier metal permitting tight adhesion of the electrode material layer while preventing diffusion of electrode material into the substrate.

11. The method of claim 10, wherein the barrier metal is titanium or tantalum.

12. The method of claim 1, wherein the metal lining layer comprises titanium or aluminum, the electrode material layer comprises copper, and removing the exterior part of the electrode material layer comprises wet etching with sodium persulfate.

13. The method of claim 1, wherein the metal lining layer comprises titanium, the electrode material layer comprises copper, and removing the exterior part of the metal lining layer comprises wet etching with potassium hydroxide and hydrogen peroxide.

14. The method of claim 1, wherein the metal lining layer comprises aluminum, the electrode material layer comprises copper, and removing the exterior part of the metal lining layer comprises wet etching with dilute hydrochloric acid.

15. The method of claim 1, wherein above an uppermost surface of the exterior part of the metal lining layer the electrode material layer has a nominal thickness, and removing the electrode material layer comprises:
   calculating a wet etching time sufficient to remove a thickness of the electrode material layer a certain percent greater than the nominal thickness; and
   wet etching the electrode material layer for the calculated wet etching time.

16. The method of claim 15, wherein said certain percent is five percent.

17. The method of claim 15, wherein the metal lining layer has a thickness equal to said certain percent of the nominal thickness of the electrode material layer.

18. The method of claim 1, wherein forming the metal lining layer comprises:
   forming a barrier metal layer on the insulating film; and
   forming a low-resistance metal layer on the barrier metal layer, the low-resistance metal layer having a lower electrical resistance than the barrier metal layer; wherein
   the barrier metal layer and the low-resistance metal layer in combination permit tight adhesion of the electrode material layer while preventing diffusion of electrode material into the substrate.

19. The method of claim 18, wherein the barrier metal layer comprises titanium or tantalum.

20. The method of claim 18, wherein the low-resistance metal layer comprises aluminum or gold.

* * * * *